United States Patent [19]
Stern et al.

[11] Patent Number: 5,344,496
[45] Date of Patent: Sep. 6, 1994

[54] LIGHTWEIGHT SOLAR CONCENTRATOR CELL ARRAY

[75] Inventors: Theodore G. Stern; Mickey Cornwall, both of San Diego, Calif.

[73] Assignee: General Dynamics Corporation, Space Systems Division, San Diego, Calif.

[21] Appl. No.: 976,601

[22] Filed: Nov. 16, 1992

[51] Int. Cl.$^5$ .......................................... H01L 31/052
[52] U.S. Cl. ..................................... 136/246; 136/292
[58] Field of Search ................................ 136/246, 292

[56] References Cited

U.S. PATENT DOCUMENTS

| | | | |
|---|---|---|---|
| 4,153,474 | 5/1979 | Rex | 136/246 |
| 4,494,302 | 1/1985 | Knechtli et al. | 29/569.1 |
| 4,690,355 | 9/1987 | Hornung et al. | 244/173 |
| 5,131,955 | 7/1992 | Stern et al. | 136/245 |
| 5,180,441 | 1/1993 | Cornwall et al. | 136/246 |

OTHER PUBLICATIONS

T. G. Stern et al., *Conference Record, 17th IEEE Photovoltaic Specialists Conference* (May 1984), pp. 326–329.

*Primary Examiner*—Aaron Weisstuch
*Attorney, Agent, or Firm*—John R. Duncan; Frank D. Gilliam

[57] ABSTRACT

A self supporting solar concentrator cell array adapted for use in space applications that includes a plurality of cylindric parabolic reflective mirror surfaces, each of which focus recipient sunlight forwardly onto a focal line which is positioned approximately on the backside of an adjacent mirror surface on which is secured a solar element for converting the focussed sunlight into electricity. A front element extending upwardly from the leading edge of each mirror surface cooperates in providing an aperture through which the focussed sunlight passes and side elements close each cell element. The backside of each mirror is provided with a thermally emissive surface to provide mirror thermal control and allows the mirror to act as a thermal radiator fin for the solar cell elements. The mirror surface is provided with a highly reflective coating such as aluminum or silver to optimize reflectivity. The solar cell concentrator cell array is made by forming an uncured advanced organic composite part blank over a highly polished tool surface to impart the desired mirror surfaces. The solar concentrator cell array is cured, for example, by heated press means to form a unitary integral cell array that is entirely self supporting and provides structural stability while providing optimum electrical power output for minimum weight.

16 Claims, 2 Drawing Sheets

LIGHTWEIGHT SOLAR CONCENTRATOR CELL ARRAY

FIELD OF THE INVENTION

The present invention relates to an improvement in the field of solar concentrator cells for outer space applications and more particularly, but not by way of limitation, to a self supporting solar concentrator element array that is lightweight and provides the required electrical power output while being resistant to environmental and hostile threats.

BACKGROUND OF THE INVENTION

Various arrangements have been proposed in the past for providing modular solar concentrator cell arrays for spacecraft applications and to provide for their improved resistance to environmental and hostile threats. One of the major problems of such past proposals is the inherent problem of differential thermal expansion between the mirrors of the solar concentrator elements and the supporting structure as well as the tolerancing buildups of assembling separate supporting structure and the optical elements of the solar concentrator cell elements.

It would also be desirable to improve the specific electrical power provided by the previous arrangements by decreasing the mass of such arrays (W/kg), decreasing the deployed area (W/sq.m.), and to decrease the packaged volume (W/cu.m.). It would also be desirable to improve the cost and producibility factors of past arrangements while retaining high reliability, long life, and resistance to environmental and hostile threats.

None of these previous efforts, however, provides the benefits attendant with the present invention. The present invention achieves its intended purposes, objects and advantages over the prior art devices through a new, useful and unobvious combination of method steps and component elements, with the use of a minimum number of functioning parts, at a reasonable cost to manufacture, and by employing only readily available materials.

It is a general object of this invention to provide a solar concentrator cell array for space applications that incorporates an integrated advanced composite mirror and structure.

It is a further general object of the invention to provide an advanced composite mirror arrangement that needs no coefficient of thermal expansion differential stress relief.

It is yet another object of the invention to provide an integrated solar concentrator cell and structure arrangement which reduces structural mass and provides higher strength and structural stability per unit mass.

It is also an object of the present invention to provide for manufacture of the mirror element of the solar concentrator cell by replication, thereby providing high contour accuracy and eliminates polishing of the mirror surface.

The foregoing has outlined some of the more pertinent objects of the invention. These objects should be construed to be merely illustrative of some of the more prominent features and applications of the intended invention. Many other beneficial results can be attained by applying the disclosed invention in a different manner or by modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The invention is defined by the appended claims with the specific embodiments shown in the attached drawings. For the purpose of summarizing the invention, the invention may be briefly stated to contemplate a lightweight solar concentrator cell array that is particularly adapted for outer space or terrestrial applications. The solar concentrator cell array includes a plurality of longitudinally extending mirror elements, each of which is provided with an off-axis cylindric parabolic reflective surface that has a predetermined focal line and that is adapted to receive sunlight and to concentrate such light at the focal line. The front or leading edge of each mirror element is provided with an upwardly extending element which is either provided with an aperture through which the focussed light may pass or such element cooperates with a downwardly extending element from the upper trailing edge of an immediately adjacent cell to provide such an aperture.

The backside of an immediately adjacent reflecting mirror element is provided with a suitable solar cell means that is adapted to convert solar energy into electricity and is positioned at the focal line of the adjacent mirror element. The backside of each mirror element is further provided with a suitable thermal emissive coating to provide mirror thermal control and to provide a thermal radiator fin for the associated solar cell means. The mirror element may be a highly conductive composite material such as, P100, or alternately infiltrated, or doped with a suitable material to enhance thermal conductivity to provide for better performance as a radiator fin. End elements positioned at each end of the mirror elements secure the elements together in a unitary integral structure which provides a rigid box-like structure which does not require an additional support structure or stress relief means with the attendant added weight and differential coefficient of thermal expansion problems.

The invention also contemplates the manufacture of the mirror elements from a suitable advanced organic composite by replicative press forming over a highly polished die to allow formation of the mirror surface of the mirror element without additional polishing. The mirror elements are then cured according to a predetermined pressure and temperature regime. The reflectivity of the mirror surface may be enhanced by coating with a thin covering of a highly reflective metal such as aluminum or silver which be further protected by a transparent film. Alternatively, a highly reflective surface such as a metallized film like aluminized Mylar or silvered Teflon may be directly bonded to the mirror surface. The invention would also contemplate the manufacture of the novel solar concentrator cell array through such known methods as injection molding, resin transfer molding, and hand lay-up of suitable resin preimpregnated (pre-preg) carbon fiber materials.

The foregoing has outlined rather broadly the more pertinent and important features of the present invention in order that the detailed description of the invention that follows may be better understood so that the present contribution to the art may be more fully appreciated. Additional features of the invention will be described hereinafter which form the subject of the claims of the invention. It should be appreciated by those skilled in the art that the conception and the disclosed specific embodiment may be readily utilized as a basis for modifying or designing other structures and methods for carrying out the same purposes of the present invention. It should also be realized by those skilled in the art that such equivalent constructions and methods do not depart from the spirit and scope of the invention as set forth in the appended claims.

BRIEF DESCRIPTION OF THE DRAWING

For a fuller understanding of the nature and objects of the invention, reference should be had to the following detailed description taken in conjunction with the accompanying drawings in which.

Similar numerals refer to similar parts in the two embodiments.

DETAILED DESCRIPTION OF THE INVENTION

Figure 1:
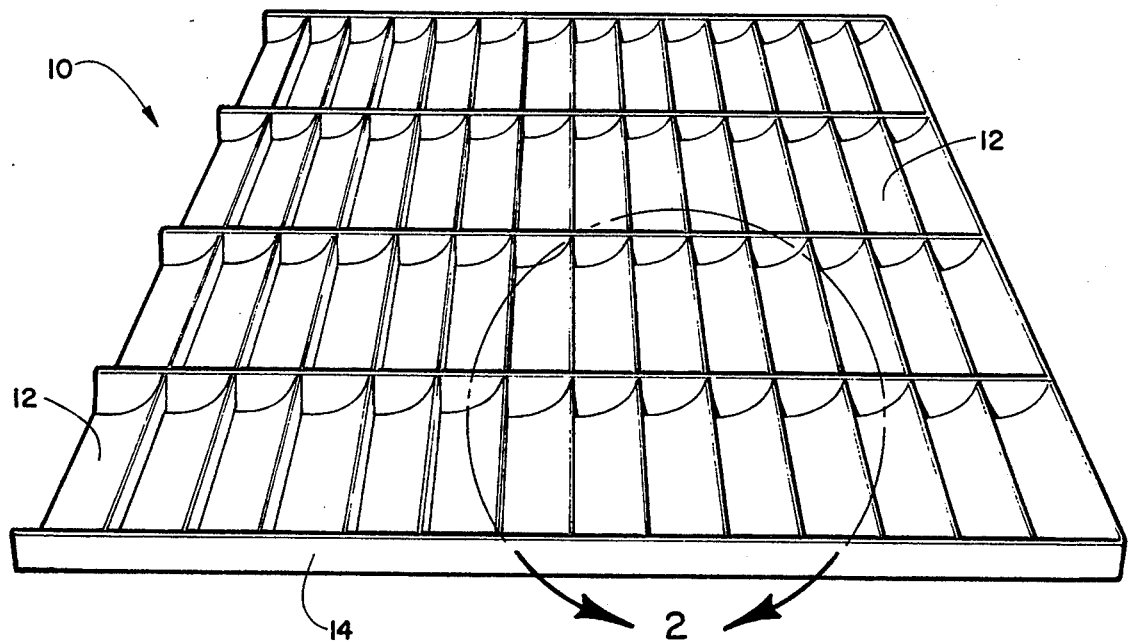
FIG. 1 is a perspective of simplified solar concentrator cell array constructed in accordance with the principles of the present invention.

Referring now to the drawings in detail, and in particular to FIG. 1, the reference character 10 generally designates a solar concentrator cell array constructed in accordance with a preferred embodiment of the present invention. The solar concentrator cell array 10 includes a plurality of individual solar concentrator cell elements 12 that are combined in a suitable array for the purpose of converting sunlight into electricity in spacecraft applications. The elements 12 were conceived as providing a honeycomb structure for such purpose.

Figure 2:
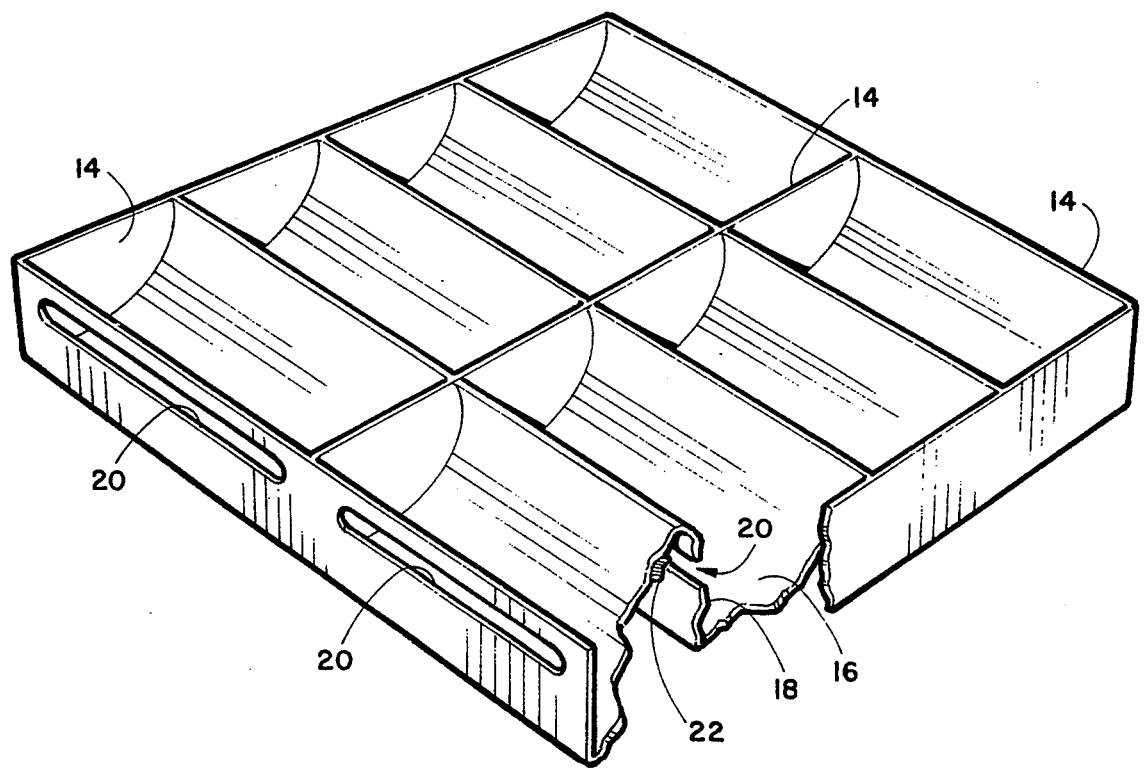
FIG. 2 is perspective of a portion of the solar concentrator cell array shown in FIG. 1, as per the circled portion, with a portion thereof being partially cut away for a better exposition of the invention.

Referring now to FIG. 2, it will be seen that each solar concentrator cell element 12 includes a mirror element 16 that is provided with an off-axis cylindrical parabolic surface having a predetermined focal line upon which sunlight falling upon the surface is focussed. Preferably, the mirror element 16 is fabricated from a suitable advanced organic composite which has the resin and reinforcing carbon element chosen to provide optimum thermal stability at the anticipated service temperature.

The mirror element 16 is provided at its leading edge with an upwardly extending front element 18 which is composed of the same advanced composite material as the mirror element 16 and as are the side elements 14. Mirror element and side elements 14 may be formed from different composite materials, if desired. The front element 18 is provided with a suitable longitudinally extending aperture 20 through which focussed sunlight reflected by the mirror element 16 passes. The mirror element 16, the side elements 14, and the front element 18 are preferably constructed from the same advanced organic composite material and are joined or formed together to form a rigid box-like structure which provides a strong light weight structure which does not require further reinforcement for the intended use.

The mirror element 16 and the front element 18 are appropriately sized to permit the focal line of the mirror element to fall approximately adjacent to the upper portion of the backside of the mirror element of an adjacent solar concentrator cell element 12. A suitable solar cell conversion element 22 is secured to the backside of each mirror element 16 at approximately the focal line of the immediately adjacent mirror element 16 for converting the focussed reflected sunlight into electricity. It will be understood that each of the solar cell conversion elements may be connected into strings as is known in the art. Alternatively, the front element 18 can extend through the aperture 20 and the solar cell 22 can be mounted upon the front element.

Figure 3:
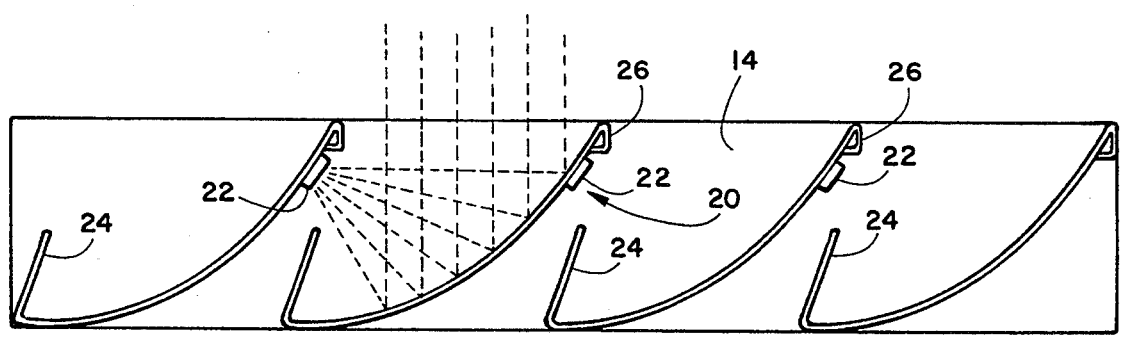
FIG. 3 is a cross-sectional view of another embodiment of the invention.
Figure 4:
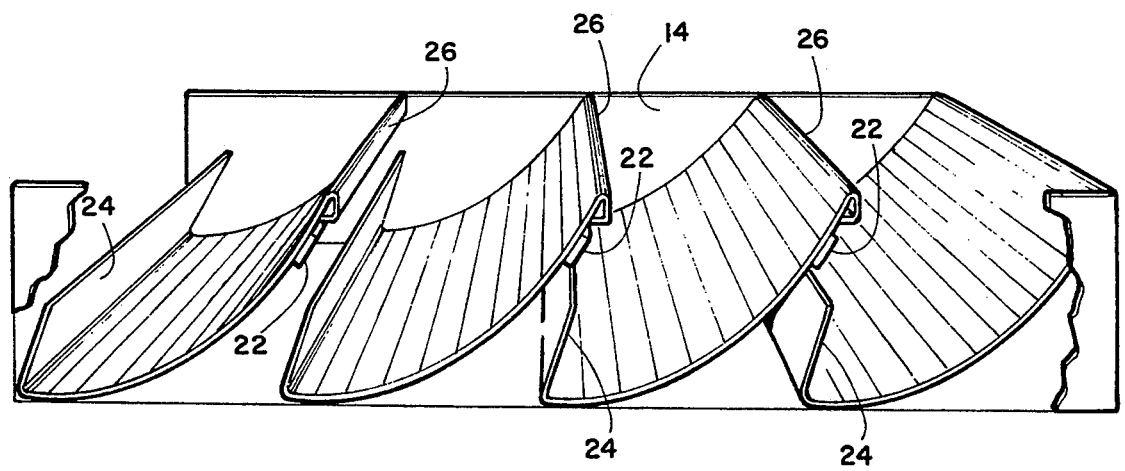
FIG. 4 is a perspective of the solar concentrator cell array of FIG. 3 with a portion of the structure shown partially in phantom.

Referring now to FIGS. 3 and 4, another embodiment of the present invention is illustrated. In this embodiment, each mirror element 16 is provided with an upwardly extending front element 24 which is positioned at its leading edge and a downwardly extending back element 26 which extends downwardly from the upper trailing edge of each mirror element 16. The back element 26 may also be folded inwardly against the back side of the mirror element 16 to provide further reinforcement. As seen in FIGS. 3 and 4, the front element 24 of one mirror element 16 cooperates with the back element 26 of an immediately adjacent solar concentrator cell element 12 to provide a suitable aperture 20 through which the focussed reflected sunlight from a mirror element 16 may fall at the focal line on a suitable solar conversion cell element 22 for conversion into electricity.

Referring specifically to the mirror element 16, it is preferably made by forming an uncured advanced organic composite over a suitably contoured highly polished tool surface and cured to form a very smooth reflective surface which requires no further finish polishing. The easily replicated mirror element is provided with a coating of a highly reflective metal such as aluminum or silver. The deposited coating of reflective metal may also be protected by suitable conventional transparent protective means such as silica or alumina. Obviously, such coating should have optimum resistance to ultra-violet radiation degradation.

Alternatively, a reflective surface comprising a metallized film as aluminized Mylar, silvered Mylar, aluminized Teflon, aluminized Kapton, silvered Kapton, or silvered Teflon can be bonded onto the reflective surface of the mirror element 16. The backside (convex) of the parabolic mirror element 16 is provided with a thermal emissive coating to provide mirror thermal control and also to allow the mirror element 16 to act as a radiator fin for the string of solar cells 22 bonded to such mirror backside. The thermal emissive coating may use a paint with low solar absorption i.e. a white paint, so to minimize extraneous absorbed thermal load from solar and earth albedo sources. To provide enhanced conductivity of the mirror element 16 for performance as a radiator fin, the mirror element 16 way also be doped or infiltrated with a high thermal conductivity material, such as silver powder. It would also be within the scope of the invention to embed a mesh of high thermal conductivity material, such as a copper mesh, aluminum mesh, or graphite mesh. The present invention permits manufacture of the honeycomb solar cell array by a number of conventional methods of manufacture. Each individual solar concentrator cell 12 could be manufactured individually and assembled together for curing of the composite but preferably the mirror elements 16 of an array 10 are replicatively formed over a highly polished tool surface and cured thereon by a platen press. Also, conventional injection molding and resin transfer molding techniques could be employed. It is also within the scope of the invention to employ hand lay-up of resin pre-impregnated carbon fiber material on a suitable tool and to use conventional vacuum bag techniques to cure the array at a suitable temperature and pressure regime.

In summary, it has been illustrated how the invention provides a lightweight mirror of a spacecraft solar concentrator that is also structurally self-supporting so as to withstand physical and thermal loading without a separate support structure. A method has been disclosed for the fabrication of the solar concentrator element array which uses a novel approach which incorporating cost-effective, available materials and techniques.

The present disclosure includes that contained in the appended claims as well as that of the foregoing description. Although this invention has been described in its preferred forms with a certain degree of particularity, it is understood that the present disclosure of the preferred form has been made only by way of example and numerous changes in the details of construction and combination and arrangement of parts and method steps may be resorted to without departing from the spirit and scope of the invention.

What is claimed is:

1. A solar concentrator cell element usable in outer space, which comprises:
   a longitudinally extending mirror element which is provided with an off-axis cylindric parabolic reflective surface that has a predetermined focal line and which is adapted to receive sunlight and to concentrate such light at the focal line;
   a front element which extends upwardly from the lower leading edge of the mirror element, said front element being provided with a longitudinally extending aperture which is sufficiently large to permit light reflected from the mirror to pass through; and
   solar cell means adapted to convert sunlight into electricity which is positioned on the backside of the mirror for receiving concentrated light passing through an aperture of the front apertured element of an adjacent solar concentrator cell.

2. The solar concentrator cell element of claim 1 which further includes spaced end elements that are secured to each end of the mirror element, with the mirror element and the end element being integrally formed from an organic composite material.

3. The solar concentrator cell element of claim 1 wherein said end elements are formed from a different composite material than said mirrors.

4. The solar concentrator cell element of claim 2 wherein the reflective surface of the mirror includes a coating of a highly reflective metal and a thin transparent protective film deposited over the metal coating.

5. The solar concentrator cell element of claim of claim 4 wherein the reflective metal is chosen from a group consisting of aluminum and silver.

6. The solar concentrator cell element of claim 2 wherein the reflective surface of the mirror comprises a metallized film bonded to the organic composite material of the mirror.

7. The solar concentrator cell element of claim 6 wherein the metallized film is chosen from a group consisting of aluminized Mylar, silvered Mylar, Aluminized Teflon, aluminized Kapton, silvered Kapton and silvered Teflon.

8. The solar concentrator cell element of claim 1 wherein the backside of the mirror element is coated with an emissive coating to provide thermal control for the mirror element and to act as a radiator fin for a solar cell means mounted thereon.

9. The solar concentrator cell element of claim 8 wherein said emissive coating is white paint.

10. The solar concentrator cell element of claim 8 wherein the organic composite material of the mirror element is infiltrated with a high thermal conductivity material.

11. The solar concentrator cell element of claim 10 wherein the high thermal conductivity material is silver powder.

12. The solar concentrator cell element of claim 8 wherein the organic composite material of the mirror element has embedded therein a metallic mesh having a high thermal conductivity.

13. A solar concentrator cell element array usable in outer space, which comprises:
   a plurality of spaced longitudinally extending mirror elements, each of which is provided with an off-axis cylindric parabolic reflective surface that is arranged to receive sunlight and to focus such sunlight in a focal line;
   a solar cell means which converts received sunlight into electricity positioned on the backside of each mirror element so as to fall within the focal line of an adjacent mirror element;
   a front element extending upwardly from the lower leading edge of each mirror element; and
   a rear element extending downwardly from the upper trailing edge of each mirror element, the rear element of the mirror element cooperating with the front element of an adjacent mirror element to form an aperture through which the focused sunlight from a mirror is directed onto the solar cell means positioned at the focal line of the mirror element.

14. The solar concentrator cell element array of claim 13 which further includes side members which are secured to the ends of the spaced mirror elements.

15. The solar concentrator cell element array of claim 14 wherein the mirror elements, the front elements, the rear elements, and the side members comprise an organic composite material whereby the aforesaid elements are formed into a unitary integral structure.

16. The solar concentrator cell element array of claim 15 wherein the reflective surface of each mirror element is provided with a highly reflective metallized coating and the opposing backside of each mirror element is provide with a thermal emissive coating to enhance thermal control for the mirror element and to act as a radiator fin for a solar cell means mounted thereon.

* * * * *